(12) United States Patent
Frisch et al.

(10) Patent No.: US 6,646,884 B1
(45) Date of Patent: Nov. 11, 2003

(54) SANDWICH-STRUCTURED INTELLIGENT POWER MODULE

(75) Inventors: Michael Frisch, Munich (DE); Bernd Winkens, Munich (DE)

(73) Assignee: Tyco Electronics Logistics AG (CH)

( * ) Notice: Subject to any disclaimer, the term of this patent is extended or adjusted under 35 U.S.C. 154(b) by 0 days.

(21) Appl. No.: 09/980,382

(22) PCT Filed: May 30, 2000

(86) PCT No.: PCT/EP00/04945

§ 371 (c)(1),
(2), (4) Date: Apr. 4, 2002

(87) PCT Pub. No.: WO00/74445

PCT Pub. Date: Dec. 7, 2000

(30) Foreign Application Priority Data

May 31, 1999 (DE) .......................... 199 24 993

(51) Int. Cl.⁷ ................................ H05K 7/00
(52) U.S. Cl. .............. 361/728; 361/770; 361/792; 361/679; 361/702
(58) Field of Search ................. 361/728, 770, 361/783, 792, 799, 679, 697, 702, 709, 711, 760, 715

(56) References Cited

U.S. PATENT DOCUMENTS

| 4,884,125 A | 11/1989 | Miura |
| 5,134,546 A | 7/1992 | Izumi et al. |
| 5,200,917 A | 4/1993 | Shaffer et al. |
| 5,484,965 A | 1/1996 | Woychik |
| 5,519,252 A | * 5/1996 | Soyano et al. ............... 257/177 |
| 5,644,475 A | 7/1997 | Woychik et al. |
| 5,751,058 A | * 5/1998 | Matsuki ...................... 257/678 |
| 5,907,475 A | * 5/1999 | Babinski et al. ............ 361/719 |
| 6,318,622 B1 | * 11/2001 | Hollingsworth et al. ..... 228/4.5 |

FOREIGN PATENT DOCUMENTS

| DE | 4305793 | 9/1994 |
| DE | 19646004 | 5/1998 |
| EP | 0463589 | 1/1992 |
| JP | 4032291 | 2/1992 |
| JP | 7030061 | 1/1995 |
| JP | 10242385 | 9/1998 |

* cited by examiner

*Primary Examiner*—David Martin
*Assistant Examiner*—Hung Bui
(74) *Attorney, Agent, or Firm*—Baker & Daniels

(57) ABSTRACT

The power substrate is inserted in a housing (1) as base plate and together with the same forms a standardized power part from whose top side (11) there are projecting terminal pins (5) which are soldered by through-soldering to via holes of the board (4). The circuit board (4), in a strip portion (6) thereof that remains free, has contact pads (7) as control and power terminals by means of which the module can be soldered directly into the slot-like opening of a system circuit board (8).

4 Claims, 1 Drawing Sheet

SANDWICH-STRUCTURED INTELLIGENT POWER MODULE

DESCRIPTION

The invention relates to an intelligent power module having control and power terminals, in which a board is arranged in a second plane parallel to a substrate having at least one power semiconductor component.

IPM (intelligent power module) structures, i.e. modules with power semiconductor components and logic or control elements integrated in the module, are utilized presently, for example, for applications in connection with welding apparatus, power supplies and in drive engineering. Especially in the field of asynchronous motors, frequency converters are employed for speed control in increasing manner, with the power part of the module making use in particular of IGBT (insulated-gate bipolar transistor) power semiconductors.

In selecting the power substrate as carrier for the required power components, care is to be taken that on the one hand high electrical insulation and on the other hand also good heat transfer is ensured towards the usually required cooling plate. The latter is not obtained with the known circuit boards of plastics material, so that the power components, depending on the application requirements, are constructed on relatively complex substrates, for example DCB (direct copper bonding) aluminum oxide, IMS (aluminum polyimide copper) or aluminum nitrite. On the other hand, the logic elements may easily be manufactured on the basis of the conventional epoxy circuit boards.

Problematic with the conventional modular technology are the connections between the logic components and the power components on the one hand and between the module and a system circuit board on the other hand. These connections, which typically make use of solder contacts, terminals, connectors or pressure contacts, frequently are a weak point in terms of quality and cause high costs. The problems become even greater with the connecting technology if, for reasons of space, a sandwich-type construction of the module is demanded in which, for example, the power substrate is connected via pins to the control or driving circuit board arranged thereabove, as it is known e.g. from EP 0 463 589, cp. FIG. 1 thereof incorporated herein by reference. In particular, in this known module the base substrate with power semiconductors is inserted into the frame of the module housing thereof, connecting lines are soldered thereto and a casting compound is introduced whereupon the the control board is inserted into the module housing and soldered to the connecting lines. Depending on the particular application, there are projecting various terminal pins from the module housing that are separately soldered to the substrates.

In addition to the complex connection technology, a major disadvantage of the known sandwich-type module consists in that this construction is suitable for custom made modules with high development or adaptation expenditure only. For example, desired changes in the control or driving circuit may necessitate a different placement or design of the connecting lines or terminal pins, and thus may have a effect on the module in its entirety, which then needs to be modified in its entirety as well.

It is an object of the invention to make available an intelligent power module that does not require complex internal and external connecting technology and thus may be manufactured with low expenditure and which may easily be adapted with respect to customized driving circuits.

According to the invention, this is achieved with an intelligent power module of the type indicated at the out-set in that the power substrate is inserted as base plate into a housing of electrically insulating material and, together with the same, forms a power part from whose top side facing the board there are projecting terminal pins at least in an edge portion, which are soldered by through-soldering to via holes of the board, with at least a strip portion along one side of the circuit board being left free from via holes and control components, and in that the circuit board, on this side, has contact pads as control and power terminals by means of which the module can be soldered directly into the slot-like opening of a system circuit board.

Accordingly, the module according to the invention basically consists of a logic part and an constructionally independent or separate and thus standardized power part. Due to the fact that the terminal pins are already part of the power part, the power parts that are standardized with respect to the mechanical design thereof may easily be connected, by through-soldering, to the control or driver part in a single flow soldering process. The board offers to the customer almost free design possibilities with respect to the driving circuit and, due to the contact pads formed on the circuit board proper, a particularly simple connecting possibility to a further circuit board. Such circuit boards which are adapted to be soldered directly into a system circuit board indeed have been known as such for a short period of time, but so far they have not been employed in connection with power modules that typically make use of sturdier constructional design elements, such as pins, bolts and plugs, and in particular they have not been employed in connection with IPMs.

Advantageous developments of the invention are subject matter of the dependent claims.

The invention will now be elucidated in more detail hereinafter by way of an embodiment with reference to the drawing figures in which.

Figure 1:
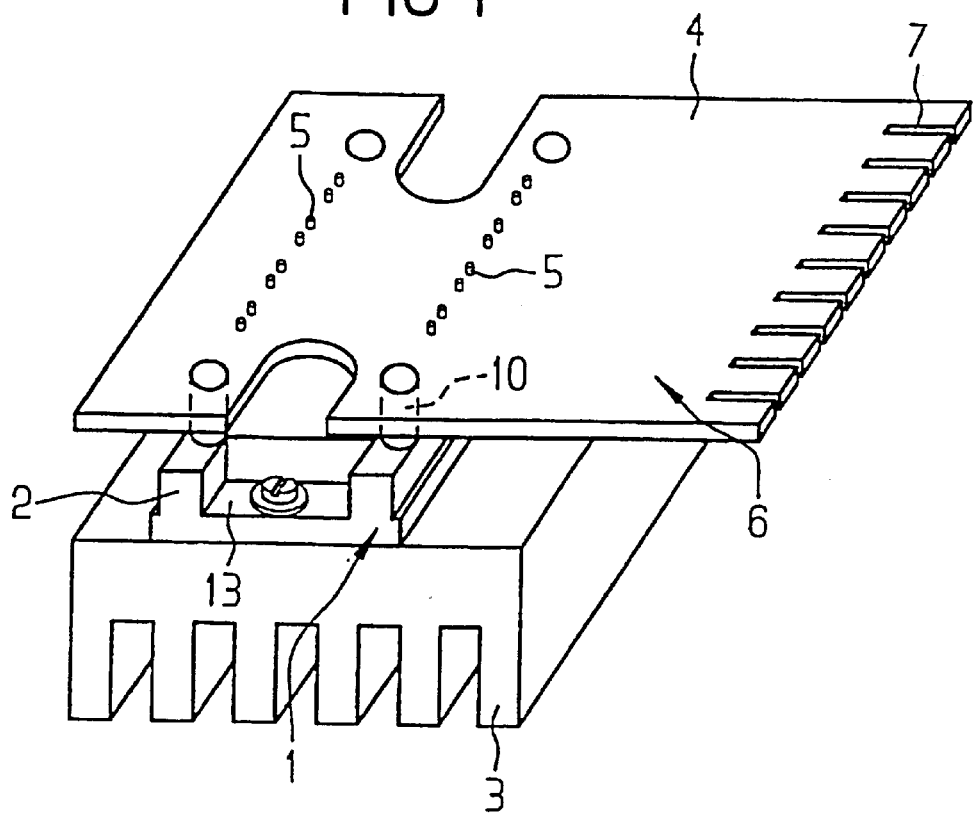
FIG. 1 shows a perspective plan view of a module according to the invention in the state in which the same is not yet soldered into a system circuit board.
Figure 2:
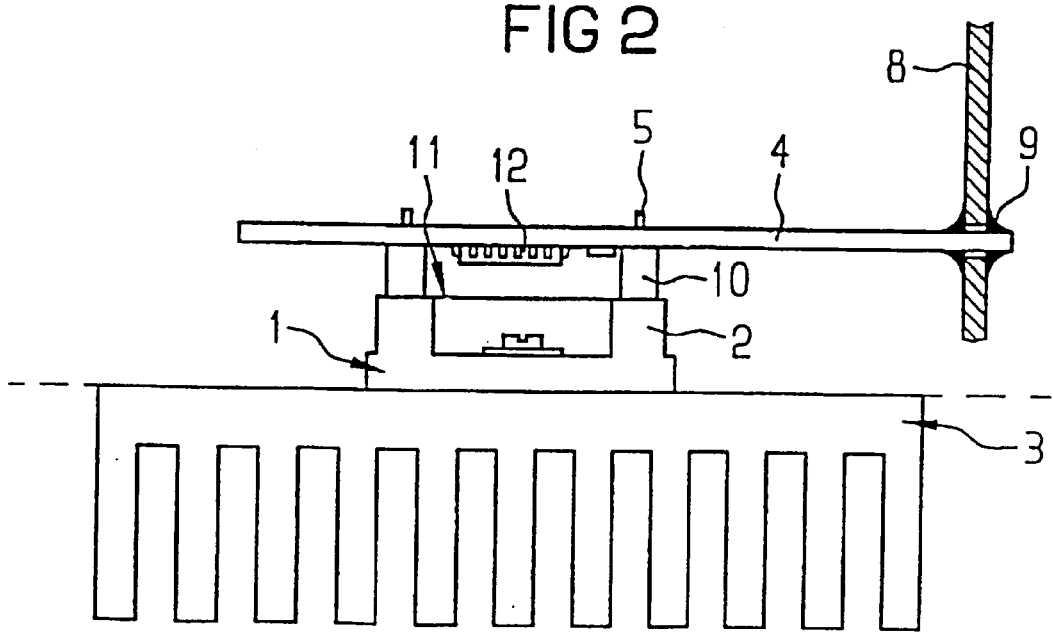
FIG. 2 shows a sectional side view of the same module as in FIG. 1, however in the finished, soldered state.

FIG. 1 shows as an example a module having a standardized power part, in which, for example, a ceramic substrate as carrier for power components 2 is inserted into a plastics housing 1 as base plate. The bottom side of the base plate usually has a heat sink 3 attached thereto. The board 4 is shown in FIG. 1 and FIG. 2 in a state in which it is applied to the upper ends of the terminal pins 5 of the power part, with the back side thereof directed upwardly; the terminal pins 5 are flow-soldered on the back side of circuit board 4. The strip portion 6 of board 4, which remains free from via holes and control or driving components 12, must be sufficiently wide to permit the formation of contact pads 7 on the circuit board 4 proper as well as insertion thereof through the opening slot of a second circuit board, referred to as system circuit board 8 here. FIG. 2 shows a module with solder points 9 soldered into a system circuit board 8.

It is advantageous if, as shown in the figures, the board 4 is greater than the power part possibly towards all sides thereof, i.e. projects beyond the same, since the circuit board 4 effectively may have the power parts inserted therein and soldered thereto and may be divided into the individual modules only thereafter. Circuit board 4 may be, for example, a plastics board customary in the trade, e.g. FR4.

Particularly advantageous is the design illustrated in the figures, in which the control components 12 possibly are arranged only in a portion of board 4 that is located directly opposite the top side 11 of the power part. This provides for circuit and space advantages. Especially with high switching frequencies in the range of 100 kHz, the electronic control components 12 should be arranged as close as possible to the gates of the power semiconductor components 2. FIG. 1 illustrates furthermore spacers 10 that are integrally formed on housing 1 and mutually support the circuit board 4 and the power part. The terminal pins 5 of the power part, as illustrated, are advantageously arranged in rows along the outer edges of the top side of the power part. Housing 1 is illustrated in FIG. 1 with a lateral opening 13 for reasons of illustration only.

The constructional design according to the invention, along with the combination of a customized control or driving circuit board that is adapted to be directly soldered into a second circuit board, with a standardized power part ensures on the one hand simple component insertion and low assembly costs. On the other hand, this construction ensures that important parts of the , such as e.g. drivers, are located directly above or below the components 2 encased in the power part. The modules may be used within a wide power range, e.g.: 600 V /5–30 A, 1200 V /2.5–15 A.

What is claimed is:

1. An intelligent power module having control and power terminals, in which a board is arranged in a second plane parallel to a power substrate being arranged in a first plane and having at least one power semiconductor component, the power substrate being inserted as a base plate into a housing of electrically insulating material so that the power substrate and the housing, forms a power part with a plurality of terminal pins facing the board and extending through the board via a plurality of holes, said holes being arranged proximate an edge portion of the board; said terminal pins being soldered by through soldering to said holes of the board, with at least a strip portion along one edge of the board being left free from the holes and control components; and said board, on a second edge, has contact pads as control and power terminals by means of which the module can be soldered directly into the slot-like opening of a system circuit board, wherein control components are arranged in a portion of the board that is located directly opposite the top surface of said at least one power semiconductor component.

2. An intelligent power module according to claim 1, wherein the board projects beyond the top side of the power part on all sides.

3. An intelligent power module, comprising:

a housing of electrically insulating material;

a power substrate having at least one power semiconductor component, the power substrate being positioned within said housing and, together with the housing forming a power part, said power substrate being arranged in a first plane;

terminal pins projecting from a top side of said power part;

a board arranged in a second plane parallel to said power substrate with said terminal pins being soldered by through soldering to the holes of the board, with at least a strip portion along an outer side of the board being left free from the holes and control components; and contact pads provided on the outer side of the board, as control and power terminals, profiled such that the module can be soldered directly into slot-like opening of a system circuit board;

wherein the control components are arranged in a portion of the board that is located directly opposite the top surface of said at least one power semiconductor substrate.

4. An intelligent power module according to claim 3, wherein the board projects beyond the top side of the power part on all sides.

* * * * *